(12) United States Patent
Chen et al.

(10) Patent No.: US 6,580,135 B2
(45) Date of Patent: Jun. 17, 2003

(54) SILICON NITRIDE READ ONLY MEMORY STRUCTURE AND METHOD OF PROGRAMMING AND ERASURE

(75) Inventors: Chia-Hsing Chen, Hsinchu (TW); Ming-Hung Chou, Miaoli Hsien (TW); Jiunn-Ren Hwang, Tainan (TW); Cheng-Jye Liu, Taoyuan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/104,849

(22) Filed: Mar. 22, 2002

(65) Prior Publication Data

US 2002/0190385 A1 Dec. 19, 2002

(30) Foreign Application Priority Data

Jun. 18, 2001 (TW) ........................................ 90114685 A

(51) Int. Cl.⁷ .............................................. H01L 29/76
(52) U.S. Cl. ........................ 257/390; 257/261; 438/151
(58) Field of Search ................................. 257/260, 225, 257/261, 681, 390, 29; 438/151

(56) References Cited

U.S. PATENT DOCUMENTS 5,940,325 A * 8/1999 Chang et al.
5,969,397 A * 10/1999 Grider, III et al.
6,380,029 B1 * 4/2002 Chang et al.
6,445,030 B1 * 9/2002 Wu et al.
6,501,147 B1 * 12/2002 Vajana et al.
6,525,370 B1 * 2/2003 Hazama

* cited by examiner

Primary Examiner—Sheila V. Clark
(74) Attorney, Agent, or Firm—J. C. Patents

(57) ABSTRACT

A silicon nitride read only memory and associated method of data programming and erasing. The read only memory includes a first type ion-doped semiconductor substrate, an oxide-nitride-oxide (ONO) composite layer over the semiconductor substrate, a first type ion-doped gate conductive layer over the ONO layer and a second type ion doped source/drain region in the substrate on each side of the ONO layer, wherein the second type ions have an electrical polarity opposite to the first type ions. Data is programmed into the silicon nitride read only memory by channel hot electron injection and data is erased from the silicon nitride read only memory by negative gate channel erase method. Since the gate conductive layer and the channel layer are identically doped, the energy gap between the two layers reduced. Hence, operating voltage of the gate terminal is lowered and damage to the tunnel oxide layer by hot holes is reduced.

6 Claims, 2 Drawing Sheets

US 6,580,135 B2

SILICON NITRIDE READ ONLY MEMORY STRUCTURE AND METHOD OF PROGRAMMING AND ERASURE

CROSS-REFERENCE TO RELATED APPLICATION

This application claims the priority benefit of Taiwan application serial no. 90114685, filed on Jun. 18, 2001.

BACKGROUND OF THE INVENTION

1. Field of Invention

The present invention relates to a semiconductor memory structure and associated method of programming and erasure. More particularly, the present invention relates to a silicon nitride read only memory (NROM) structure and associated method of programming and erasure.

2. Description of Related Art

Most conventional read only memory employs a channel transistor to serve as the principle component in each memory unit. In the programming stage, dopants are selectively implanted into designated channel region for changing the threshold voltage such that the 'On' or 'Off' state of a memory transistor is set. The structure of a read only memory includes a word line running perpendicularly across a bit line so that the channel of the memory unit is formed in the region underneath the word line between the bit lines. Whether a binary bit '0' or '1' is stored in a read only memory unit depends on the implantation of ions in the channel.

Following the rapid development of electrically erasable and programmable read only memory (EEPROM), the storage of bit data inside a read only memory unit no longer depends on the implantation of ions into the channel. A type of oxide-nitride-oxide (ONO) EEPROM has an ONO layer formed above the channel area between the bit lines. This ONO layer is capable of isolating the overlapping polysilicon word lines and the silicon nitride layer is capable of trapping electric charges. Hence, data can be programmed into a memory unit with ease.

FIG. 1 is a schematic cross-sectional view showing a conventional silicon nitride read only memory unit. The memory structure includes a substrate 10, a source region 11, a drain region 12, an oxide-nitride-oxide (ONO) composite layer 18 and a polysilicon gate 16 above the layer 18. The ONO layer 18 is formed over the substrate 10. The ONO layer 18 actually comprises a silicon nitride layer 14, a bottom oxide layer 13 and a top oxide layer 15. Both the source region 11 and the drain region 12 are formed within the substrate 10 on each side of the ONO structure 18. A channel region 17 is formed underneath the ONO structure 18 between the source region 11 and the drain region 12.

In a conventional semiconductor transistor, the source terminal, the drain terminal and the gate terminal generally are doped identically, for example, p-doped or n-doped. As shown in FIG. 1, N-type ions are implanted into the source region 11, the drain region 12 and the gate region 16 so that these regions are all in the n-doped state.

The silicon nitride layer 14 inside the ONO composite structure 18 has the capacity for trapping electric charges. In memory programming, suitably programmed voltages are applied to the source terminal 11, the drain terminal 12 and the gate terminal 16 respectively. Electrons in the source terminal 11 move into the channel 17 and flow towards the drain terminal 12. During the electron flow, a portion of the electrons may penetrate the bottom oxide layer 13 and halt within the silicon nitride layer 14. Such a penetration of electrons through the bottom oxide layer 13 into the silicon nitride layer 14 is often referred to as a tunneling effect.

There are two major conditions in which tunneling occurs. One type of tunneling is referred to as a channel hot electron injection while the other type of tunneling is referred to as Fowler-Nordheim tunneling. FIG. 2 is a schematic cross-sectional view showing hot electron injection inside a conventional nitride read only memory. As shown in FIG. 2, a positive voltage is applied to the gate terminal 26 so that the channel 27 is opened. When a relatively large bias voltage is applied between the source terminal 21 and the drain terminal 22, a large number of excess hot electrons 29 is generated inside the channel 27. A portion of the hot electrons 29 penetrates the bottom oxide layer 23. Through the edges of the bottom oxide layer 23, electrons move into the silicon nitride layer 24. Such a transfer of electrons into the silicon nitride layer 24 is also known as hot electron injection. To remove the electrons 29 within the silicon nitride layer 24, a negative voltage is applied to the gate terminal 26 so that electrons 29 can penetrate through the bottom oxide layer 23 and channel into the drain terminal 22. This is a reverse operation of the hot electron injection and is often called negative gate drain erase (NGDE).

FIG. 3 is a schematic diagram showing a FN tunneling of electrons into a silicon nitride layer inside a conventional silicon read only memory. As shown in FIG. 3, when a bias voltage is applied to the source terminal 31 and the drain terminal 32, a positive voltage applied to the gate terminal 36 opens up the channel 37. Hence, electrons 39 are able to pass through the channel 37. If a relatively large positive voltage is applied to the gate terminal 36, electrons 39 within the channel 37 penetrate through the bottom oxide layer 33 into the silicon nitride layer 34. This is the so-called FN tunneling effect. On the other hand, to drive the electrons 39 trapped within the silicon nitride layer 34 away, a relatively large negative voltage is applied to the gate terminal 36. The trapped electrons 39 within the silicon nitride layer 34 penetrate through the bottom oxide layer 33 into the channel 37. This is a reverse operation of the FN tunneling often called the negative gate channel erase (NGCE).

Conventionally, the programming and erasing of data in a silicon nitride read only memory can have two different modes. In the first operating mode, electrons are induced into the silicon nitride layer via FN tunneling while trapped electrons are driven off by negative gate channel erase (NGCE). In the second operating mode, electrons are induced into the silicon nitride layer via hot electron injection while trapped electrons are driven off by negative gate drain erase (NGDE).

Because the doped ions in the gate conductive layer and the doped ions in the channel are in opposite states, differences in energy levels between the two layers are relatively large. Hence, if electrons are collected via FN tunneling, a rather large operating voltage must be applied to the gate terminal. Therefore, the tunneling oxide layer (or the bottom oxide layer) must have high reliability. Conversely, to remove trapped electrons by negative gate drain erase, electrons within the silicon nitride layer are held back strongly due to the great energy gap between the material layers. The application of a negative voltage at the gate terminal leads to a portion of the hot holes penetrating the bottom oxide layer into the silicon nitride layer, thereby erasing some of the electrons within the silicon nitride layer. However, the movement of hot holes from the bottom oxide layer may seriously damage the structure of the bottom oxide layer and degrade the isolating property of the oxide layer. Ultimately, overall reliability of the semiconductor memory device deteriorates.

SUMMARY OF THE INVENTION

Accordingly, one object of the present invention is to provide a silicon nitride read only memory and associated programming and erasing method. The silicon nitride read only memory has identically ion doped gate conductive layer and channel so that the energy gap between the two layers is brought closer together. Ultimately, operating voltage at the gate terminal is reduced and damage to the tunnel oxide layer by hot holes is prevented.

To achieve these and other advantages and in accordance with the purpose of the invention, as embodied and broadly described herein, the invention provides a silicon nitride read only memory. The read only memory includes a first type ion-doped semiconductor substrate, an oxide-nitride-oxide (ONO) composite layer over the semiconductor substrate, a first type ion-doped gate conductive layer over the ONO layer and a second type ion doped source/drain region in the substrate on each side of the ONO layer, in which the second type ions have an electrical polarity opposite to the first type ions.

This invention also provides a method of programming data into and erasing data from the aforementioned silicon nitride read only memory. Channel hot electron injection is used to program data into the silicon nitride read only memory while negative gate channel erase method is used to erase data from the read only memory.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
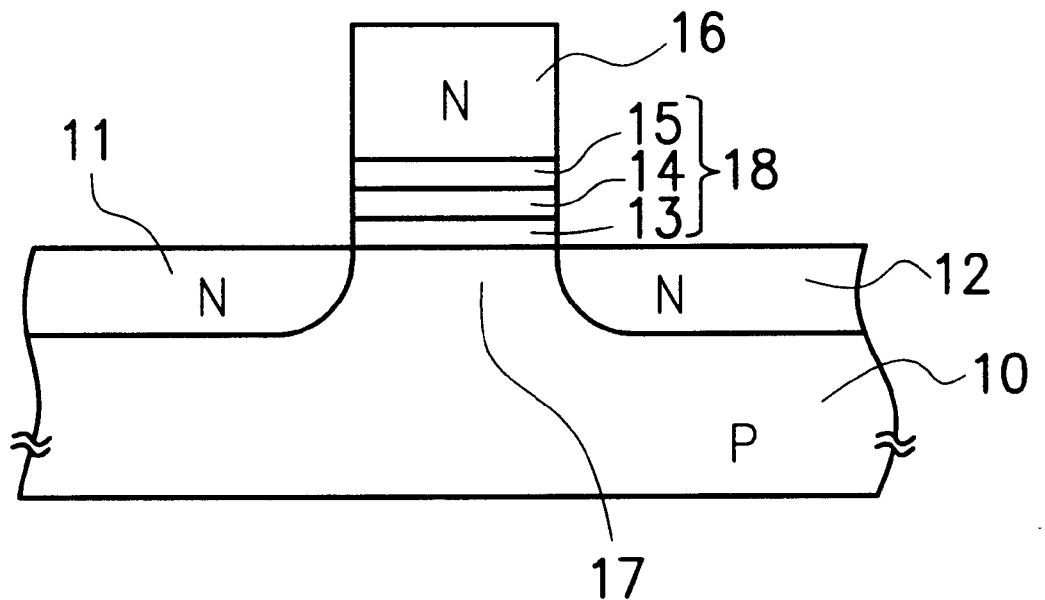
FIG. 1 is a schematic cross-sectional view showing a conventional silicon nitride read only memory unit.
Figure 2:
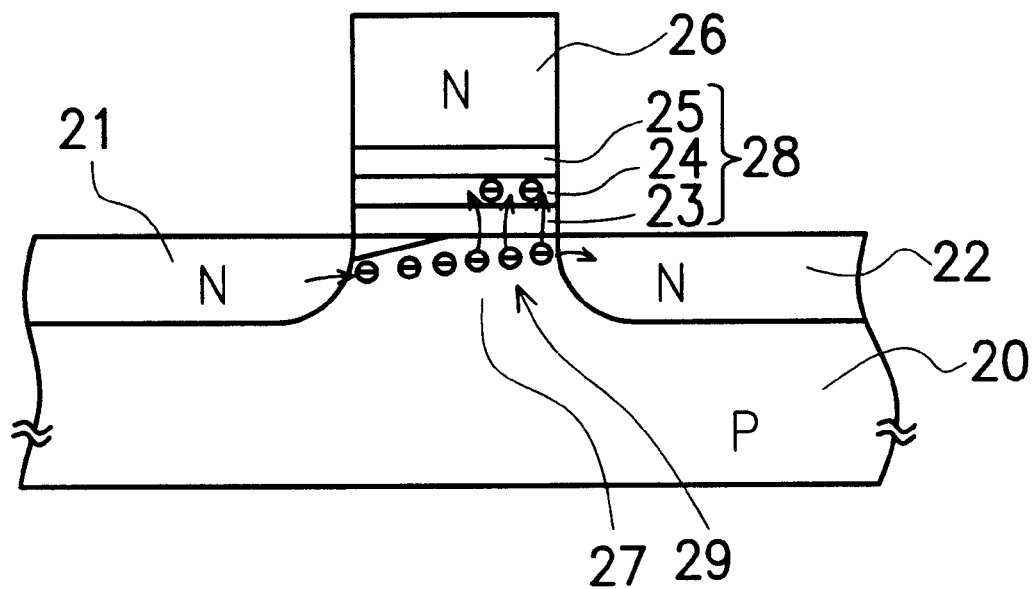
FIG. 2 is a schematic cross-sectional view showing hot electron injection inside a conventional nitride read only memory.
Figure 3:
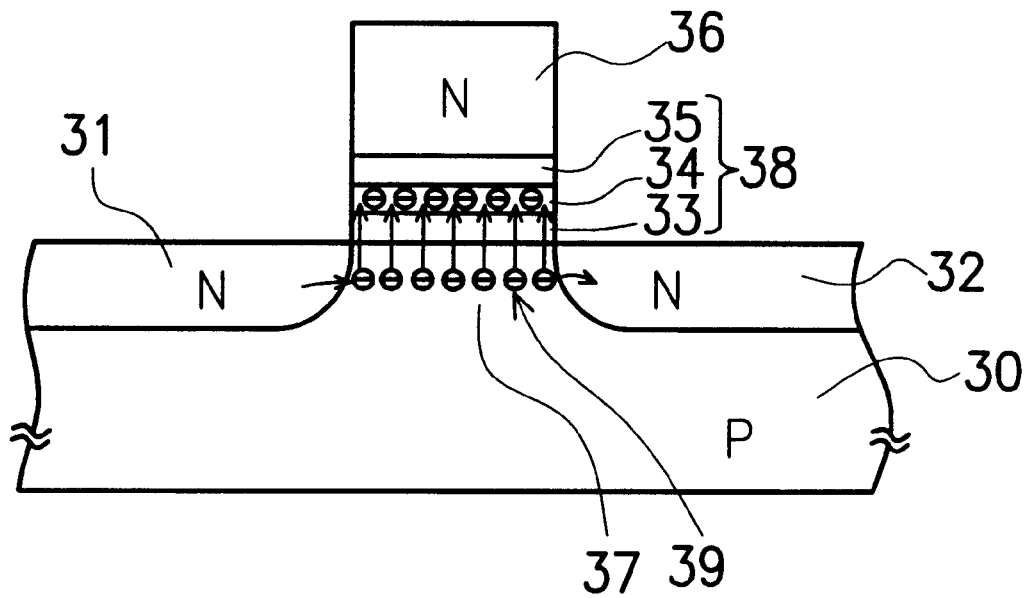
FIG. 3 is a schematic diagram showing a FN tunneling of electrons into a silicon nitride layer inside a conventional silicon read only memory.

Reference will now be made in detail to the present preferred embodiments of the invention, examples of which are illustrated in the accompanying drawings. Wherever possible, the same reference numbers are used in the drawings and the description to refer to the same or like parts.

Figure 4:
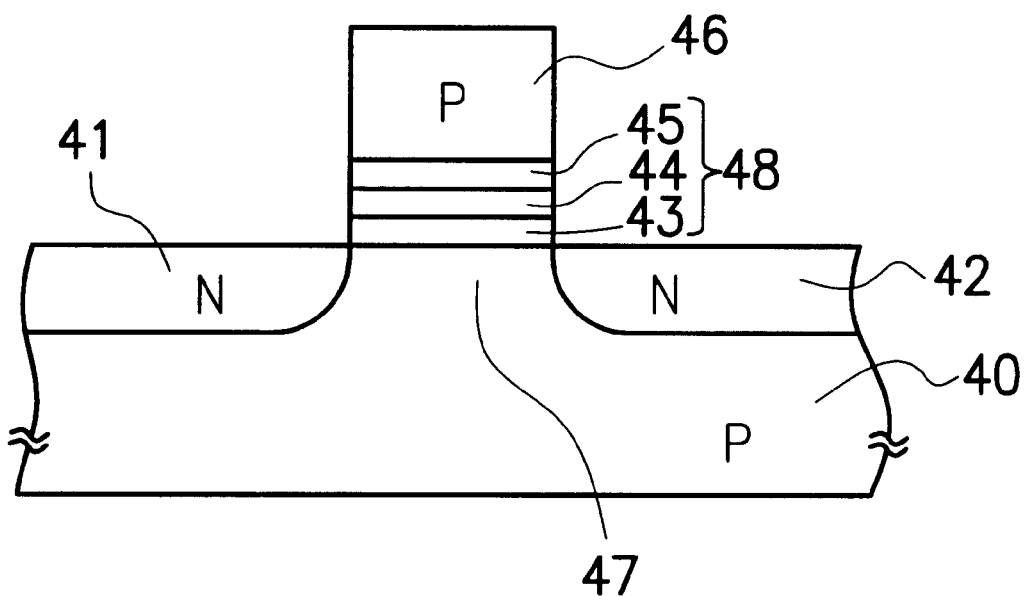
FIG. 4 is a schematic diagram showing a silicon nitride read only memory structure fabricated according to one preferred embodiment of this invention.

FIG. 4 is a schematic diagram showing a silicon nitride read only memory structure fabricated according to one preferred embodiment of this invention. As shown in FIG. 4, the silicon nitride read only memory includes a first type ion doped semiconductor substrate 40, an oxide-nitride-oxide (ONO) composite layer 48 over the semiconductor substrate 40, a first type ion doped gate conductive layer 46 over the ONO layer 48, a second type ion doped source region 41 and a second type ion doped drain region 42 in the semiconductor substrate 40 on each side of the ONO layer 48. The first type ions can be N-type ions and the second type ions can be P-type ions, for example. The ONO layer 48 further includes a bottom oxide layer 43, a silicon nitride layer 44 and a top oxide layer 43 having direct contact with the gate conductive layer 46.

Compared with a conventional silicon nitride read only memory, the ion-doping state of the gate conductive layer 46 in this invention is altered so that the gate conductive layer 46 and the channel 47 have identical doping states. Since the gate conductive layer 46 and the channel 47 are doped identically, the energy gap between the two material layers is greatly reduced. Hence, when data need to be programmed into the memory unit or erased from the memory unit, a lower voltage can be applied to the gate terminal 46. Furthermore, electrons within the channel 47 or electric charges trapped inside the silicon nitride layer 44 much more easily jump over the energy barrier erected by the bottom oxide layer 43 leading to faster memory programming and erasing speed.

This invention also provides a method of programming data into and erasing data from the aforementioned silicon nitride read only memory. Preferably, channel hot electron injection is used to program data into the silicon nitride read only memory while negative gate channel erase method is used to erase data from the read only memory.

Due to a reduction of energy gap between the gate conductive layer and the channel, electrons in the channel can easily cross the energy barrier set up by the bottom oxide layer and step into the silicon nitride layer with the application of a small bias voltage. Hence, programming by channel hot electron injection is very much facilitated.

Similarly, due to a reduction of energy gap between the gate conductive layer and the channel, electrons trapped inside the silicon nitride layer can easily cross the energy barrier set up by the bottom oxide layer into the channel with the application of a small bias voltage. Hence, memory erasing by negative gate channel erasing is increased. Furthermore, damage to the tunnel oxide layer resulting from hot holes passing through the bottom oxide layer is greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A silicon nitride read only memory, comprising:
   a first type ion doped semiconductor substrate;
   an oxide-nitride-oxide (ONO) composite layer over the semiconductor substrate;
   a first type ion doped gate conductive layer over the ONO layer; and
   a second type ion doped source/drain region in the semiconductor substrate on each side of the ONO layer;
   wherein the second type ions have a polarity opposite to the first type ions.

2. The memory of claim 1, wherein the first type ion includes P-type ions.

3. The memory of claim 1, wherein the second type ions include N-type ions.

4. A method of programming data into and erasing data from a silicon nitride read only memory according to claim 1, the method comprising:

programming data into the memory by channel hot electron injection; and erasing data from the memory by negative gate channel erasing.

5. The method of claim 4, wherein the first type ions include P-type ions.

6. The method of claim 4, wherein the second type ions include N-type ions.

* * * * *